(12) United States Patent
Hwang et al.

(10) Patent No.: US 6,445,977 B1
(45) Date of Patent: Sep. 3, 2002

(54) CARRIER HANDLING APPARATUS FOR A MODULE IC HANDLER, AND METHOD THEREFOR

(75) Inventors: Ji Hyun Hwang; Hyun Joo Hwang, both of Kyungki-do (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 09/495,471

(22) Filed: Feb. 1, 2000

(30) Foreign Application Priority Data

Feb. 1, 1999 (KR) .............................................. 99-3280
May 10, 1999 (KR) ............................................ 99-16610

(51) Int. Cl.[7] ................................................. G06F 7/00
(52) U.S. Cl. ..................... 700/228; 700/230; 198/345.1
(58) Field of Search ................................. 700/228, 230; 198/345.1, 345.3

(56) References Cited

U.S. PATENT DOCUMENTS

| | | | | |
|---|---|---|---|---|
| 5,700,127 A | * | 12/1997 | Harada et al. | 414/222 X |
| 5,901,829 A | * | 5/1999 | Ito | 198/345.1 X |
| 5,947,258 A | * | 9/1999 | Yap et al. | 198/346.1 X |
| 5,975,835 A | * | 11/1999 | Mochida et al. | 414/751 X |
| 6,112,905 A | * | 9/2000 | O'Connor et al. | 198/345.1 X |
| 6,135,699 A | * | 10/2000 | Yutaka et al. | 29/743 |
| 6,163,146 A | * | 12/2000 | Suzuki et al. | 324/158.1 |
| 6,248,967 B1 | * | 6/2001 | Nakamura | 209/573 |
| 6,354,792 B1 | * | 3/2002 | Kobayashi et al. | 414/795.6 |

* cited by examiner

*Primary Examiner*—Joseph E. Valenza
*Assistant Examiner*—Gene O. Crawford
(74) *Attorney, Agent, or Firm*—Fleshner & Kim, LLP

(57) ABSTRACT

The present invention relates to a carrier handling apparatus for a module IC (integrated circuit) handler and method therefor, for performing effective tests while carrier having a plural module ICs therein are transferred between the processes. The present invention includes a base frame, a vertical frame being provided perpendicular to one side of the base frame, carrier units being fixed at a top of a carrier holder, the carrier holder being disposed parallel at upper portion surfaces of the base frame and provided to slide along LM guide rails, respective press units being provided, corresponding to respective carrier units, at one side of the vertical frame, and for connecting the module ICs contained in the carrier unit, and a driving motor providing with pulley provided at one side of the vertical frame so as to slidably move rightward and leftward the carrier unit connected thereto by means of a timing belt.

30 Claims, 13 Drawing Sheets

CARRIER HANDLING APPARATUS FOR A MODULE IC HANDLER, AND METHOD THEREFOR

BACKGROUND OF THE INVENTION

1. Field of the Invention

The present invention relates to a carrier handling apparatus for a module IC (integrated circuit) handler and method therefor, used for testing the performances of the module ICs having been produced, and more particularly to a carrier handling apparatus for a module IC handler and method therefor, for performing effective tests while carrier having a plural module ICs therein are transferred between the processes, and providing the carrier being capable of loading and transferring the module ICs with various lengths.

2. Description of the Conventional Art

Typically, a module IC refers to a structure provided with a substrate having one side or both sides thereof for fixedly mounting a plurality of ICs and electronic components, for example, by soldering, and has a function for extending a capacity when it is mounted at a mother substrate.

Such module IC provides higher added-value when sold, as compared with individual sale of each IC as a final product. To this end, the IC manufactures tend to develop it as main product and sell it.

However, the module IC as a product available from the market is relatively expensive and thus entails higher reliability as an important factor. This requires strict quality test for passing only product determined to be good, and otherwise, modifying or discarding all the module ICs determined to be not good.

In the prior art, there has been no apparatus for automatically loading the module ICs as final products into a test socket, testing the same, classifying into respective categories depending upon the test results and then unloading the classified modules into the customer trays.

To test the completed module ICs, the operator manually has to pick up one piece of the module IC from the test tray in which the module ICs are contained therein, load it into the test socket, conducts the test for a time period preset, and finally classify the module IC depending upon the test result in order to put it the customer tray. This results in lower productivity due to the manual work.

Further, such tedious repetition contributes to lower productivity.

To solve such a problem, the inventors developed an automatic module IC handler adapted to test the module ICs, disclosed in Korean patent and utility model applications. FIG. 1 is a schematic plan view showing the prior module IC handler. The following is to explain the method for handling the module ICs contained in the tray.

A loading side picker 6 is shown which is adapted to move along the X-Y axes 4, 5. The picker 6 moves to a tray 4 located at a loading side, and then descends. Then, the picker 6 picks up plural module ICs from the tray, and then holds same.

After the picker 6 holding the module ICs elevates up to the top dead point thereof, the picker 6 then moves to a test site 7 along the X-Y axes 4, 5. The picker 6, after arriving at the test site 7 and being moved downward, places the plural module ICs on tops of test sockets positioned at the test site 7.

Such sequential procedures permit the placement of the plural module ICs on the test sockets. This is repeatedly performed until all test sockets at the test site 7 have the module ICs therein, respectively.

After the plural module ICs have been placed on the test sockets, all the ICs are simultaneously pushed downward so that patterns formed at both sides of the module IC can be in contact with terminals of the test socket.

The module ICs are tested for a time period preset by a tester. The performance test results are reported to a central processing unit.

After the test for the module ICs has been finished, a separate pusher is operated to discharge the module ICs from the test sockets. At this time, an unloading side picker 8, disposed on the Y-axis, holds plural module ICs from the test-sockets, classifies same depending on the test results, and then places the sorted ICs into a customer tray 9.

The details of the above-mentioned procedures are given below. With fingers of the picker 6 for holding both edges of the module IC being fully opened, the loading side picker 6 is moved to the tray 3 in order to hold the module ICs contained in the tray 3.

After the loading side picker 6, under such a condition of the picker 6, is moved to the tray 3 along the X-Y axes 4, 5, the picker 6 is positioned above the module IC, and then descends at that position, the fingers are moved inwardly toward each other to hold the module IC.

The picker 6 holding the module IC by such procedures is moved to the test site, and then descends. The fingers are outwardly spread to place the module IC on the test socket. After the plural module ICs are placed on the test sockets by the loading side picker 6, the loading side picker 6 is moved to the tray side so as to hold new module ICs.

With the repetition of such sequential procedures, the module ICs to be tested can be loaded into the plural test sockets located at the test site. Thereafter, a main cylinder and poking cylinder are operated to drive the pusher to be moved downward. The downward movement of the pusher presses top surfaces of the module ICs placed on the test sockets. Therefore, the patterns formed at both sides of the module IC can be in contact with terminals of the test socket. The performance tests for the module ICs can thus be achieved.

After the completion of the tests for the module ICs, a discharging cylinder is made driven to rotate a discharging lever for extracting the module ICs inserted into the test sockets. Thereafter, another picker at the unloading side is moved to the test site side along the X-Y axes 4, 5 and holds the module ICs IC having finished the test. The module ICs classified according to the test results are placed into the customer tray.

However, since the prior handler is operated in such a manner that it uses the loading side picker to hold the module ICs and to directly transfer the held ICs into test socket located at the test site, the following problems are caused.

Firstly, since the picker holds the module ICs to load/unload the IC into/from test socket, the picker cannot be used to handle the module ICs in a sealed chamber, and therefore only the tests under a room temperatures is possible.

Thus, the module ICs passed in the tests, but tested only at a normal temperature, become available from the market. However, because the module IC is actually driven at higher temperature in using such a module IC mounted on the appliances, there occurs a difference between both conditions at the test and at an actual use of the IC, thus resulting in lower reliability of the product discharged.

Secondly, since the module ICs in the tray and in the test socket are held and transferred by the picker, the transfer of the module IC cannot be made during the tests. Therefore, an elongated cycle time is introduced, by which lots of module ICs cannot be tested during a time interval given.

Finally, since the module ICs are directly handled by the picker, it permits only a horizontal installation of the test socket in the test site. In case another type of the module ICs are to be tested, inconvenience of exchanging the socket assembly occurs.

To sole such problems, it was proposed a scheme of using a carrier for accommodating the module ICs and for carrying the carrier between the test processes so as to further enhance the product reliability.

In case the carrier is used to receive therein the module ICs and transfer the carrier, at first, the loading side picker holds the module ICs in the tray and then sequentially loads same into the carrier horizontally placed at the loading position. The carrier having therein the module ICs is horizontally moved to a loading side rotator to be locked thereto. Then, a shutter of a heating chamber is opened, the carrier is stood at right angle, and this carrier is lowered to release its locked state. While the carrier is moved by one step in the heating chamber, the module IC is heated at a test condition.

The shutter between the heating chamber and the test site is opened, through which the carrier in the heating chamber is horizontally transferred to the test site side. This carrier is then pushed in a direction perpendicular to the carrier moving direction, so that patterns of the module ICs can be in contact with terminals of the test socket. Then, the test is performed for a preset time period. Subsequently, after opening a shutter between the test site and the unloading chamber, the carrier is horizontally moved to be locked to the unloading side rotator. The unloading side rotator is returned to its horizontal placement, and the carrier is extracted from the unloading side rotator and moved to the unloading position. The unloading side picker takes and holds the modules IC from the horizontally placed carrier located at the unloading position, and unloads the sorted module ICs according to the test results into the customer tray. The carrier of which the module ICs have been completely unloaded is horizontally moved to the loading position. Thus, the sequential movement of the carrier can be achieved accordingly.

However, such sequential movements of the carrier are for a single carrier in the system. The completion of a single carrier movement needs to provide another subsequent carrier. This may not cause a significant problem at the time of testing a smaller amount of the module ICs. But, the tests for a larger amount of the module ICs are not suitable due to a longtime needed to provide the carrier, resulting in lag of work and lowered productivity.

Moreover, in case different spacing between the support bases of the carrier are adopted depending upon the kinds of the module ICs, it is required to prepare extra carriers corresponding to relatively many kinds of the module ICs. Therefore, there is a problem in that the cost necessary for preparing the required carriers is needed.

SUMMARY OF THE INVENTION

An object of the present invention is to provide a carrier handling apparatus for a module IC handler, having the purposes of providing two carriers, but of a simple structure of the apparatus for reducing the dimension of the apparatus and enhancing its efficiency.

Another object of the present invention is to provide a method for handing carriers of a module IC handler which, in a system, provides two carriers each containing the module ICs therein and is able to thereby simultaneously perform the loading/unloading and testing of the module ICs, and therefore reduces the time needed to test and improves the workability.

Another object of the present invention is to make it possible the use of a single carrier, this carrier allowing various types of module ICs to be transferred and loaded by adjusting carrier spacing according to lengths of the module ICs.

To accomplish the above objects, a carrier handling apparatus for a module IC (integrated circuit) handler according to the present invention comprises:

a base frame;

a vertical frame being provided perpendicular to one side of the base frame;

carrier units being fixed at a top of a carrier holder, the carrier holder being disposed parallel at upper portion surfaces of the base frame and provided to slide along LM guide rails;

respective press units being provided, corresponding to respective carrier units, at one side of the vertical frame, and for connecting the module ICs contained in the carrier unit; and a driving motor providing with pulley provided at one side of the vertical frame so as to slidably move rightward and leftward the carrier unit connected thereto by means of a timing belt.

The carrier unit is comprised of a carrier, a block, a spring, a sensor and a catcher holder, wherein the carrier is fixed on upper portion of the carrier holder to receive plural module ICs and is shaped like a box, the block is fixed at both side portions of the carrier, the spring is installed between the block and the carrier holder and functions to elastically restore the positioning of the carrier, the sensor is used to detect whether or not the module IC is placed in position, the catcher holders respectively provided at both front and back sides of the carrier are coupled to a catcher of the press unit and function to extract the carrier from a test socket.

Further, the carrier unit comprises:

a case for receiving the plural module ICs;

guides being horizontally disposed opposing to each other in inner sides of the case;

moving support bases, each being provided with insertion members each for inserting the plural module IC; and operating means for adjusting a spacing between the moving support bases.

The operating means comprises;

a hole formed in the moving support base;

a guide rod slidably penetrating through the hole, and having both ends thereof fixed to the case;

double-threaded screw having a right-handed screw and a left-handed screw, each being screwed into each of the moving support base, wherein when the double-threaded screw is rotated, each of the moving support bases screwed into both threaded portions of the screw is moved inwardly or outwardly to each other; and driving means being coupled to rotate the double-threaded screw.

Also, the driving means comprises:

a pair of first pulleys being fixed into the double-threaded screw;

a second pulley being fixedly mounted on the case;

a belt operatively connecting the first pulleys and the second pulley;

a motor coupled to a revolution axis to rotate the second pulley at predetermined speed; and a control unit being operated to rotate clockwise or counterclockwise the motor or to reduce or increase in speed of the motor through the use of switch provided.

The second pulley is provided with tension adjusting means for maintaining power-transmission efficiency by adjusting tension of the belt.

The tension adjusting means comprises:

a bracket provided such that the revolution motion of the second pulley is possible, and coupled to the motor;

an elongated hole formed in the bracket; and a bolt used to fasten the bracket to the case through the elongated hole.

Between the moving support bases 203 and the guide rod 205, is provided a position confinement means for constantly maintaining the position after being moved.

The position confinement means comprises:

a fixing hole formed in the moving support base and penetrated through up to the hole; and a fixing bolt installed to be screwed into the fixing hole.

The driving means comprises a rotating knob coupled to the second pulley.

The press unit comprises:

a unit bracket provided at one side of the vertical frame, and provided with a motor bracket formed on an upper portion of the unit bracket;

a pair of guides vertically installed at both sides of the unit bracket for a vertical slidable motion.;

a ball screw vertically provided between the pair of guides;

a guide plate fixedly connecting the guide plates and the top portion of the ball screw;

catcher fixing blocks fixed to lower portions of the pair of guides, respectively;

a module press unit installed at lower portion of the catcher fixing blocks and functioning to insert the module ICs into the test socket for the tests;

a plurality of catchers provided at both sides of the catcher fixing block, respectively, and functioning to extract the carrier; and a press unit motor installed at one side of the motor bracket and coupled to upper portion of the ball screw which protrudes above the guide plate, and being operated to vertically move the catcher fixing blocks.

To accomplish the above-mentioned objects, a method for handling carrier of a carrier handling apparatus is provided, the method comprising the steps of:

an indexing/testing step in which the respective carriers, containing module ICs to be tested, at their initial positions are moved to a press/test position and a loading/unloading position;

testing the module IC contained in the carrier having been moved to the press/test position in said preceding step, and moving the carrier positioned at the loading/unloading position to an unloading tray elevator;

after the carrier being moved to the unloading elevator, moving another carrier from the loading tray elevator to the loading/unloading position;

an indexing/testing step of moving the test-finished carrier in the press/test position to its initial position, and of moving the carrier moved to the loading/unloading position to the test/press position;

testing the respective carriers having been moved from the loading/unloading position to the press/test position, and moving the test-finished carriers, having been returned to their initial positions, to the unloading tray elevator; and after the respective test-finished carriers being moved to the unloading tray elevator, loading the carriers to their initial positions in the loading tray elevator.

BRIEF DESCRIPTION OF THE DRAWINGS

FIG. 10 is a schematic diagram showing a whole system of the carrier handling apparatus, FIG. 11 is a process diagram showing a step of indexing/testing the carrier by using the carrier handling apparatus, FIG. 12 is a process diagram showing a step of unloading the carrier, FIG. 13 is a process diagram showing a step of loading the carrier from a tray elevator, FIG. 14 is a process diagram showing a step of indexing/testing the loaded carrier, and FIG. 15 is a process diagram showing a step of unloading the test-finished carrier, and FIG. 16 is a process diagram showing a step of loading the carrier from the tray elevator.

DETAILED DESCRIPTION OF THE INVENTION

Figure 1:
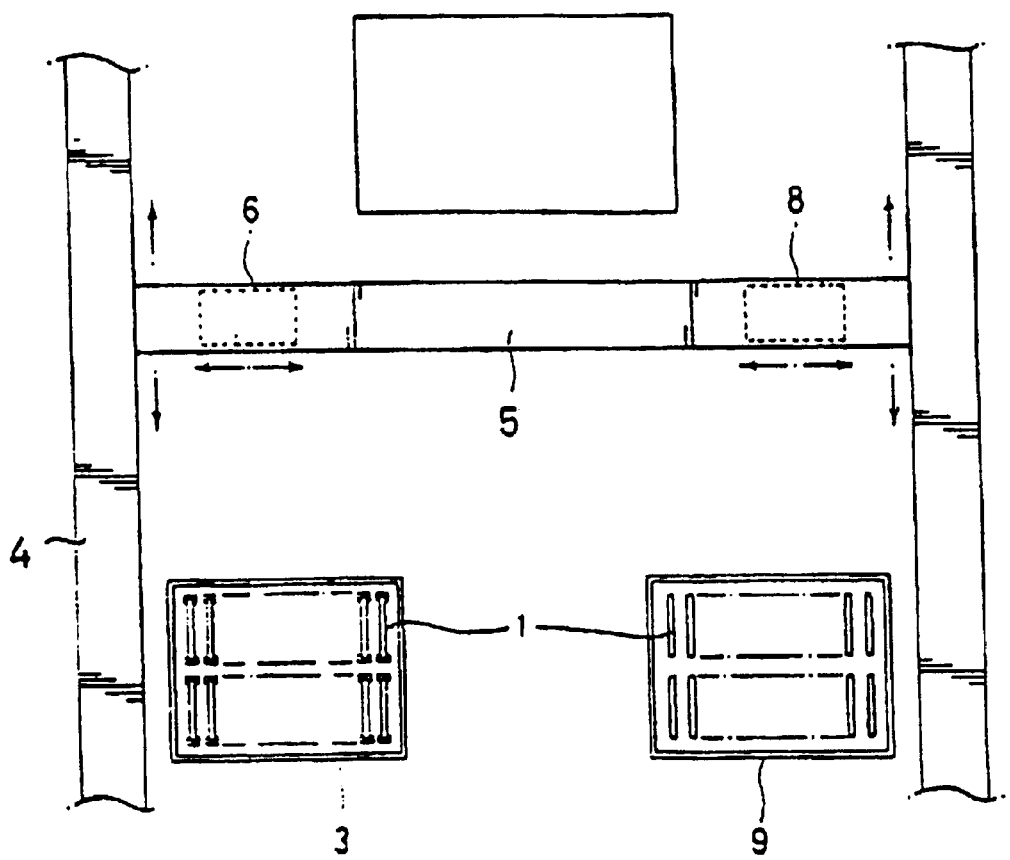
FIG. 1 is a schematic plan view of the prior module IC handler.

Referring to the accompanying drawings, a structure of the present invention will be described in detail.

An apparatus according to the present invention is comprised of a base frame 12, a vertical frame 10, a carrier unit 106, a press unit 104, and a driving motor 16.

The vertical frame 10 is provided perpendicular to one side of the base frame 12.

The carrier unit 106 is fixed at a top of a carrier holder 22 provided such that it slides along LM guide rails 14 disposed parallel at upper portion surfaces of the base frame 12.

The press unit 104 is provided, corresponding to respective carrier units 106, at one side of the vertical frame 10, and functions to connect the module ICs contained in the carrier unit 106.

The driving motor 16 is used to drive a pulley 18 provided at one side of the vertical frame 12 so as to slidably move rightward and leftward the carrier unit 106 connected thereto by means of a timing belt 20.

The carrier unit 106 is comprised of a carrier 24, a block 32, a spring 28, a sensor 30 and a catcher holder 52.

The carrier 24 fixed on upper portion of the carrier holder 22 receives a plural module ICs 26 and is shaped like a box. The block 32 is fixed at both side portions of the carrier 24. The spring 28 is installed between the block 32 and the carrier holder and functions to elastically restore the positioning of the carrier. The sensor 30 is used to detect whether or not the module IC is placed in position. The catcher holders 52 respectively provided at both front and back sides of the carrier 24 are coupled to a catcher 38 of the press unit 104 and function to extract the carrier from a test socket.

It is noted that it is possible to employ different configurations of the carrier as shown in FIGS. 4 to 8. The carrier according to further embodiments will be described below, with reference to the accompanying drawings.

Figure 4:
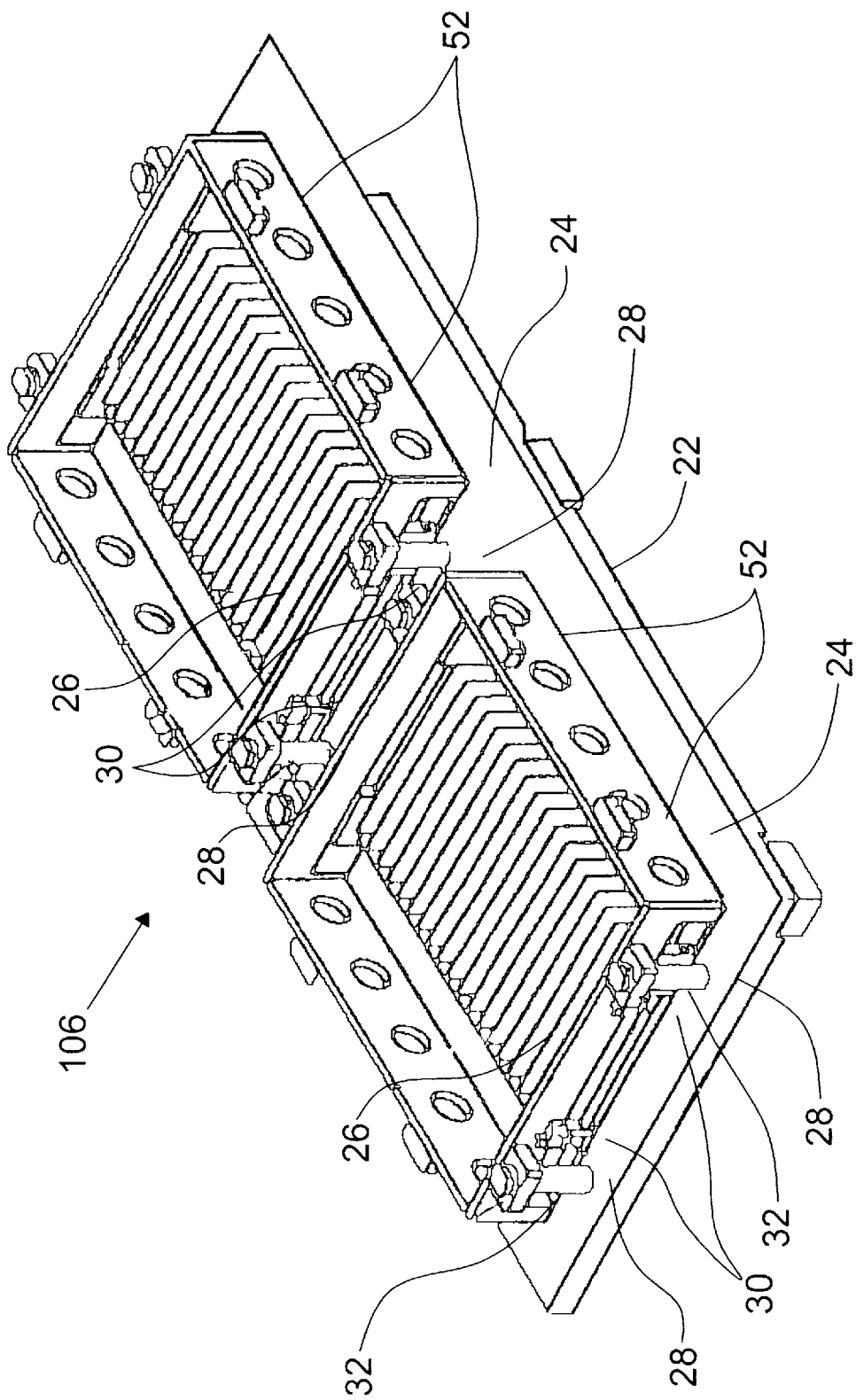
FIG. 4 is a perspective view showing one embodiment of a carrier used for containing the module ICs according to the present invention.
Figure 5:
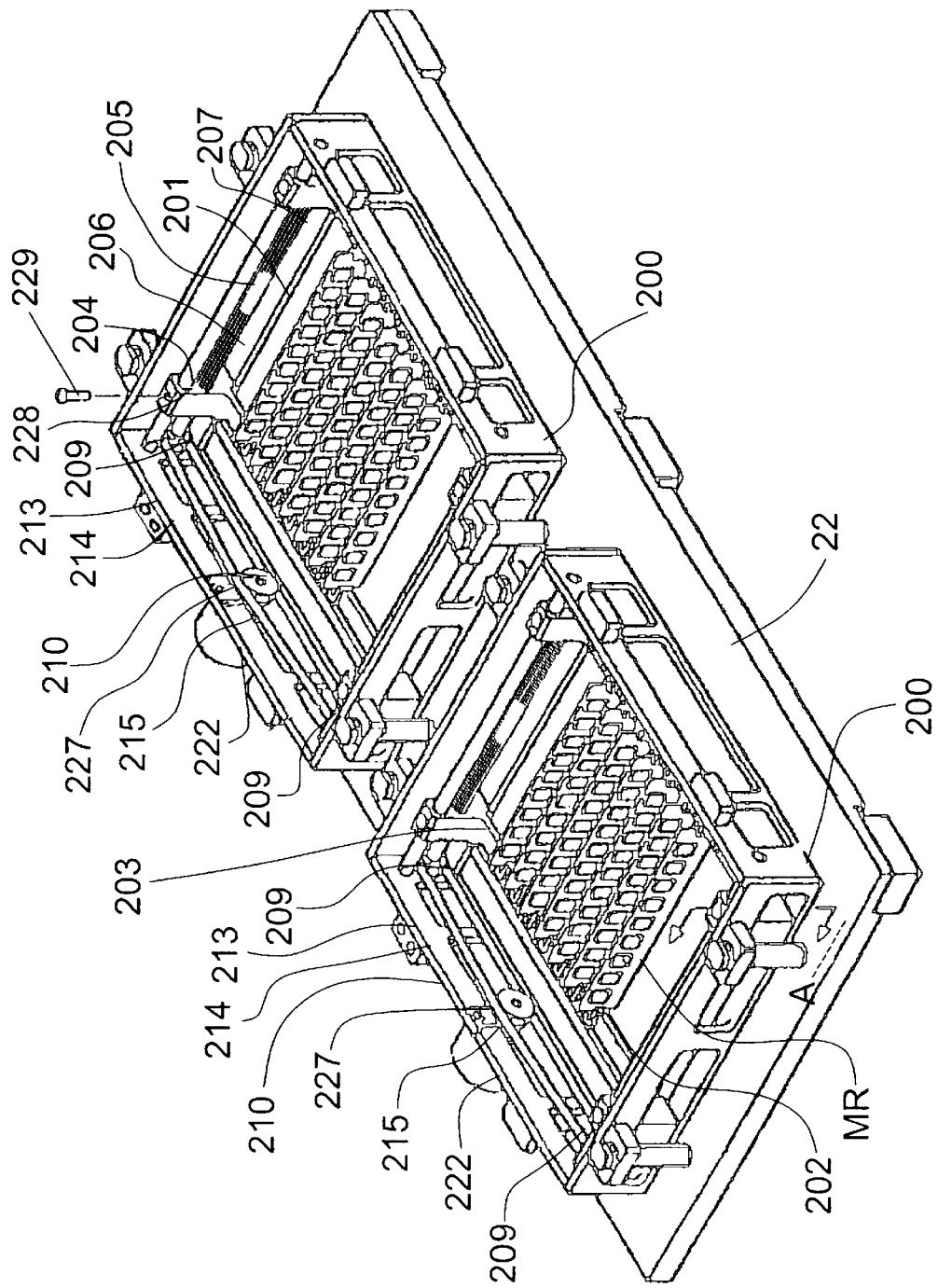
FIG. 5 is a perspective view showing another embodiment of a carrier used for containing the module ICs according to the present invention.
Figure 6:
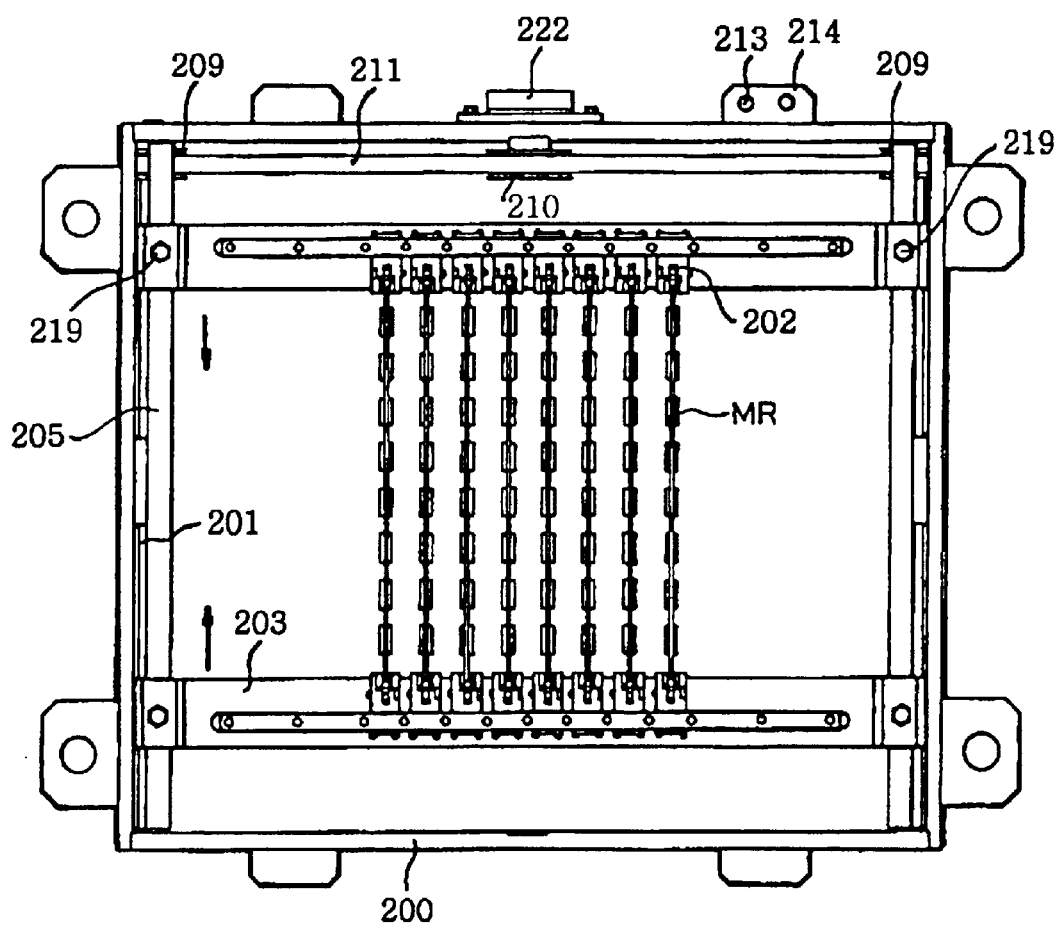
FIG. 6 is a plan view of FIG. 5.
Figure 7:
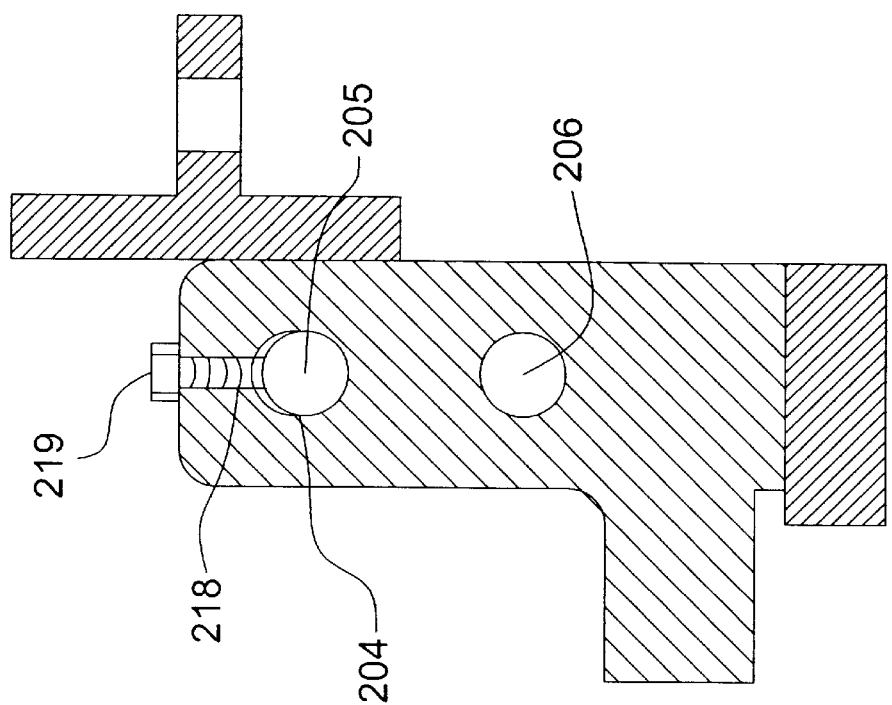
FIG. 7 is an enlarged sectional view taken along line A—A, showing a coupled state of a fastening bolt.
Figure 8:
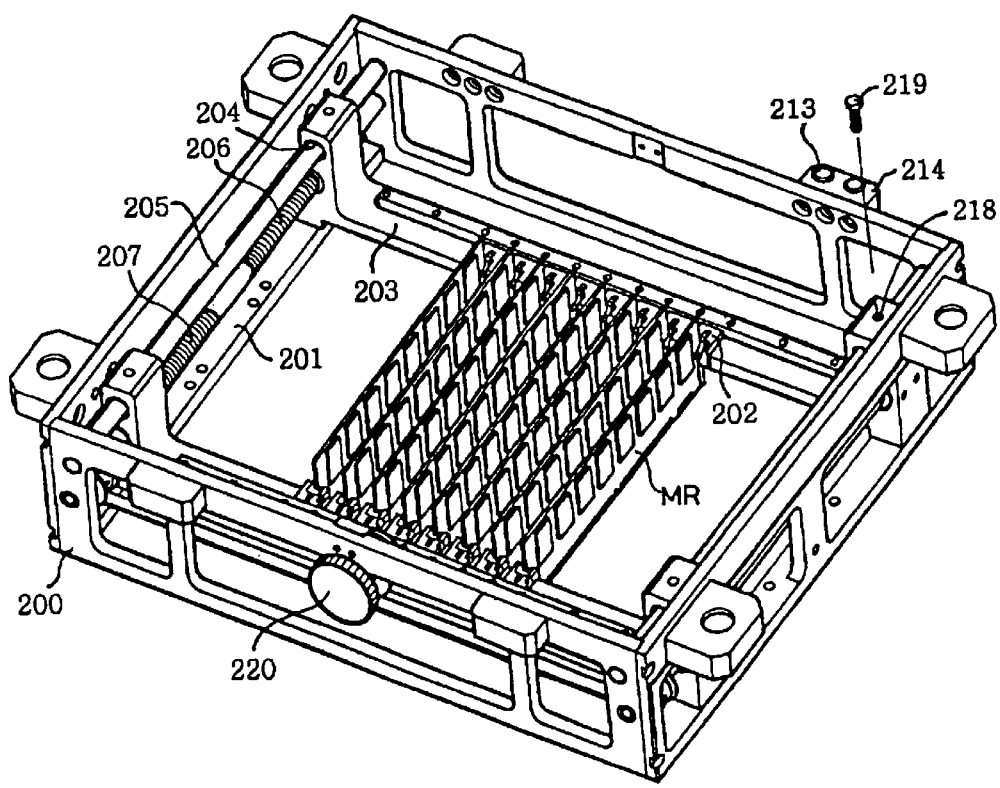
FIG. 8 is a perspective view showing another embodiment of the carrier containing the module ICs of the present invention.

FIG. 4 is a perspective view shown one embodiment of the carrier containing the module ICs of the present invention, FIG. 5 is a perspective view showing another embodiment of the carrier containing the module ICs of the present invention, FIG. 6 is a plan view of FIG. 5, FIG. 7 is an enlarged sectional view taken along line A—A, showing a coupled state of a fastening bolt, and FIG. 8 is a perspective view showing another embodiment of the carrier containing the module ICs of the present invention.

As shown in the drawings, the carrier consists of guides 201, a moving support base 203 and an operating means. The guides 201 are horizontally disposed opposing to each other in inner sides of a case 200. The guides 201 support to slide the moving support bases 203, each being provided with insertion members 202 each for inserting the plural module IC. The operating means is provided to adjust a spacing between the moving support bases 203.

In other words, while the operating means is operated to adjust the spacing between the moving support bases 203 in such a manner that a constant spacing therebetween is maintained in compliance with a size of the module IC so that the module IC can be received and transferred.

The operating means consists of a hole 204, a guide rod 205, double-threaded screw 206 and a driving means. The moving support bases 203 are provided with the hole 204. The guide rod 205 slidable penetrates through the hole 204, and has both ends thereof fixed to the case 200. The double-threaded screw 206 has a right-handed screw and a left-handed screw, each being screwed into each of the moving support base 203. Therefore, when the screw 206 is rotated, each of the moving support bases 203 screwed into both threaded portions of the screw 206 is moved inwardly or outwardly to each other. Also, the driving means is coupled to rotate the double-threaded screw 206.

The driving means consists of a pair of first pulleys 209, a second pulley 210, a belt 211, a motor 222 and a control unit 214.

The first pulleys 209 are fixed into the double-threaded screw 206. The second pulley 210 is fixedly mounted on the case 200. The belt 211 operatively connects the first pulleys 209 and the second pulley 210. The motor 222 is coupled to a revolution axis to rotate the second pulley 210 at a predetermined speed. The control unit 214 is operated to rotate clockwise or counter-clockwise motor 222 or to reduce or increase in speed of the motor 222 through the use of switch 213 provided.

The reduction or increment in speed of the motor 222 may be readily made by using a speed-reduction motor, etc., having a built-in speed reduction device therein, and by using a DC motor.

Further, the second pulley 210 is provided with a tension adjusting means for maintaining power-transmission efficiency by adjusting tension of the belt 211. The tension adjusting means consists of a bracket 215, an elongated hole 216, and a bolt 217. The bracket 215 is provided such that the revolution motion of the second pulley 210 is possible, and coupled to the motor 222. The elongated hole 216 is formed in the bracket 215, and the bolt 216 is used to fasten the bracket 215 to the case 200 through the elongated hole 216.

Namely, the ascending/descending motion of bracket 215 is made possible in the elongated hole 216, so that the tension of the belt 211 can be actually adjusted.

Between the moving support bases 203 and the guide rod 205, is provided a position confinement means for constantly maintaining the position after being moved, and which may consists of, as shown in FIG. 7, a fixing hole 218 formed in the moving support base 203 and penetrated through up to the hole 204, and a fixing bolt 219 installed to be screwed into the fixing hole 218.

In other words, with the positional confinement of the guide rod 205 when the fixing bolt is tightened, an adjusted condition of the moving support bases 203 ensures to be firmly maintained.

Apparently, even though an operator manually makes a fine adjustment by using a rotating knob 220 simply coupled to the second pulley 210, as shown in FIG. 8, without employing such a driving means, the same effect can be obtained.

The operation and advantages of the present invention will be described. The operator manipulates the switch 213 so as to load, for example, 72-pin module IC into the carrier.

With the operation of the switch, the motor 212 starts to operate, thereby the second pulley 210 coupled to the motor 212 being rotated at a predetermined speed and in a predetermined rotational direction (clockwise or counterclockwise).

The rotation of the second pulley 210 causes the first pulley 209 coupled to the second pulley 210 through the belt 211 to be rotated. With the rotation of the first pulley 209, the double-threaded screw 208 is also rotated, thereby the spacing between the moving support bases 203 being adjusted.

For example, when the double-threaded screw 208 is rotated clockwise, the spacing between the moving support bases 203 becomes narrow, and when rotated counterclockwise, the spacing becomes wider.

When the spacing has been suitably adjusted, the fixing bolt 219 is tightened, during which a bottom surface of the fixing bolt 219 presses the guide rod 205 to confine the movement of the guide rod 205, consequently to firmly maintain the moving supper bases 203.

Under the condition that the spacing between the moving support bases 203 is adjusted, the 72-pin module ICs are loaded and transferred. In case the module ICs as the subject to be moved, are exchanged with, for example, 128-pin module IC, the fixing bolt 219 is released, and then the switch 213 is operated.

In case of 129-pin module IC with longer length as compared with that of 72-pin module IC, the switch is operated to rotate the motor 222, the first and second pulleys 209, 210 so that the spacing between the moving support bases 203 becomes wider.

If the spacing between the moving support bases 203 becomes wider and is suitable for the length of 128-pin module IC, the motor 222 is deactivated and then, as described above, the fixing bolt 219 is fastened to firmly maintain the guide rod 205. Then, the 128-pin module ICs can be loaded and transferred.

It is apparent that, as shown in FIG. 8, the carrier in accordance with another embodiment of the present invention employs a rotating knob 220 which the operator manipulates, the knob being manually rotated to adjust the spacing between the moving support bases 203.

Also, the press unit 104 consists of a unit bracket 36, guides 44, a ball screw 42, a guide plate 40, catcher fixing blocks 46, a module press unit 104, a catcher 48, and a press unit motor 34.

The unit bracket 36 is provided at one side of the vertical frame 10, and provided with a motor bracket 38 formed on an upper portion of the unit bracket 36. A pair of guides 44 are vertically installed at both sides of the unit bracket 36 for a vertical slidable motion. The ball screw 42 is vertically provided between the pair of guides 44. The guide plate 40 fixedly connects the guides 44 and the top portion of the ball screw 42. The catcher fixing blocks 46 are fixed to lower portions of the pair of guides 44, respectively. The module press unit 104 installed at lower portion of the catcher fixing blocks 46 functions to insert the module ICs into the test socket for the tests. The plural catchers 48 provided at both sides of the catcher fixing block 46, respectively, functions to extract the carrier. The press unit motor 34 installed at one side of the motor bracket 38 is coupled to upper portion of the ball screw 42 which protrudes above the guide plate 40, and is operated to vertically move the catcher fixing blocks 46.

Figure 2:
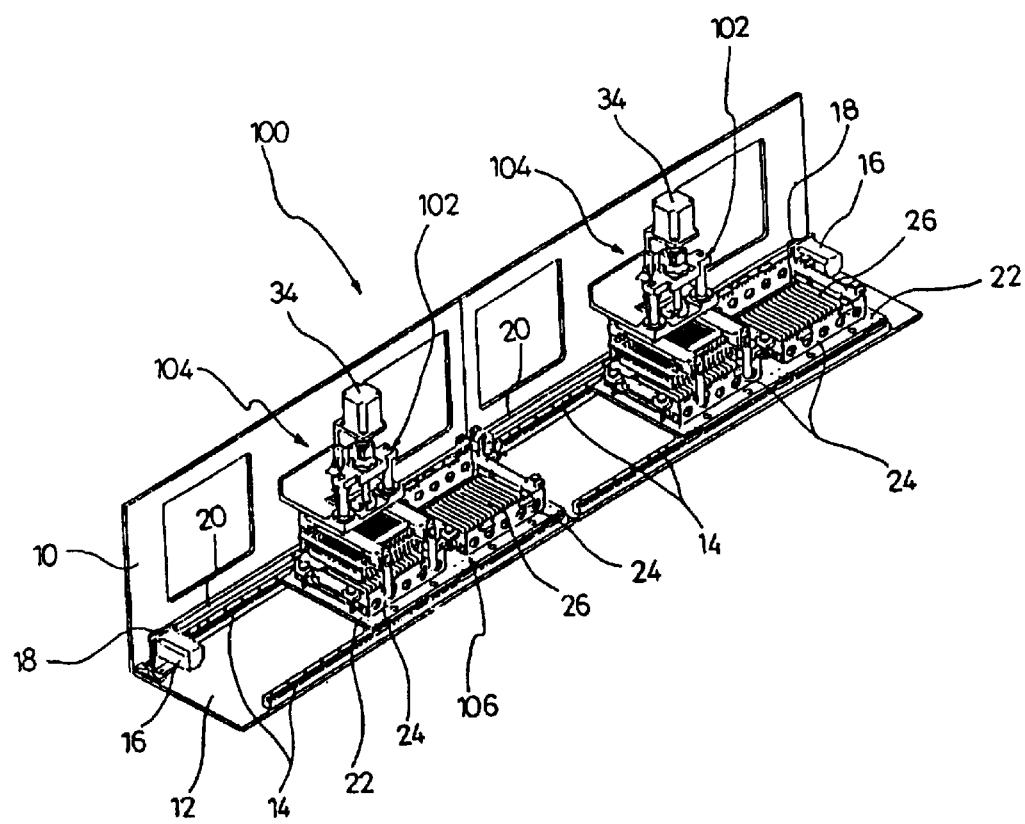
FIG. 2 is a perspective view showing a carrier handling apparatus of the module IC handler.
Figure 3:
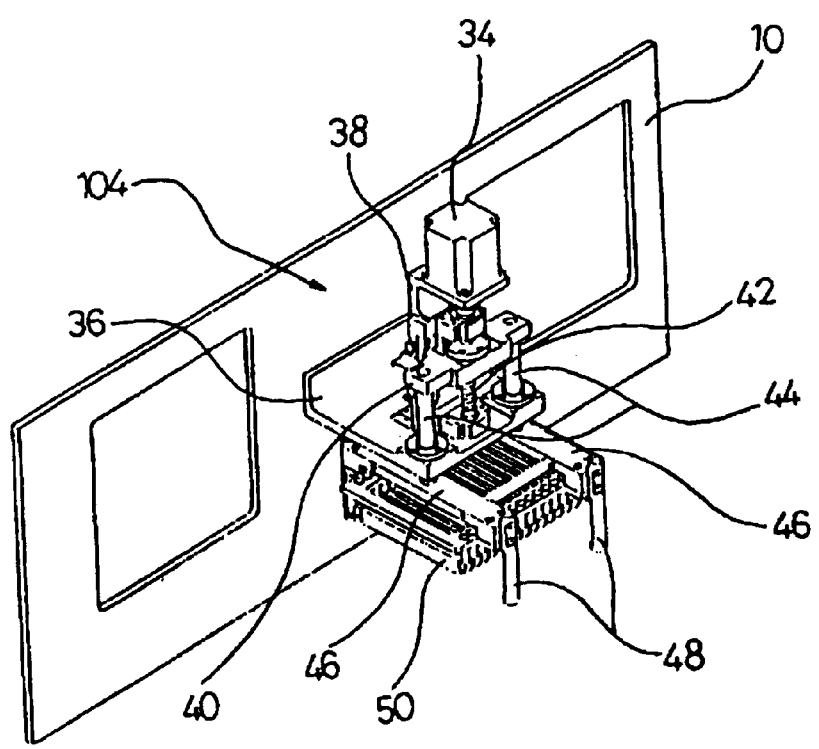
FIG. 3 is a perspective view showing the press unit used for testing the module ICs according to the present invention.
Figure 9:
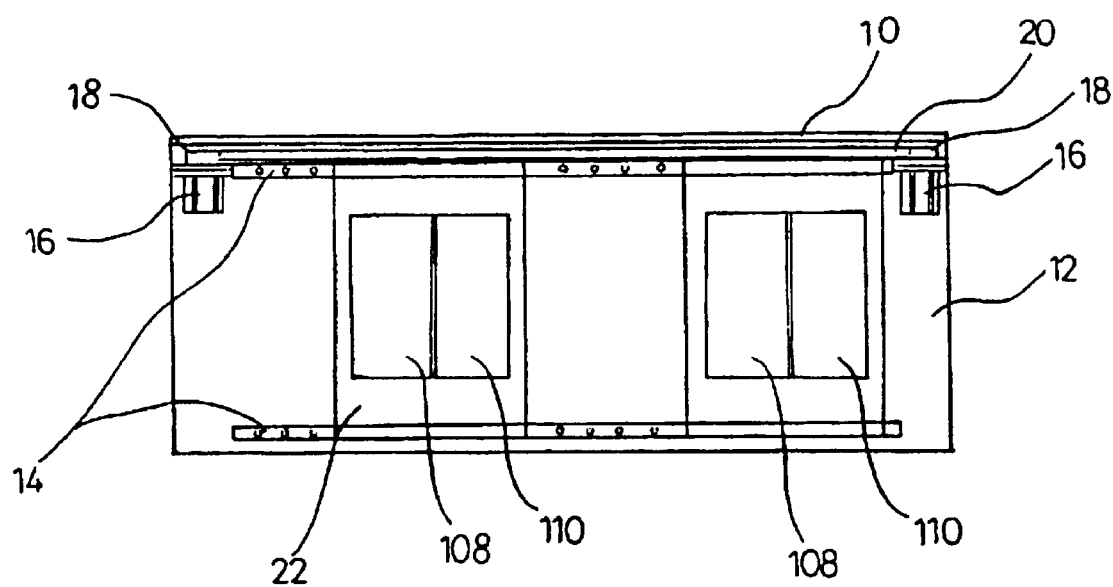
FIG. 9 is a plan view of the carrier handling apparatus according to the present invention.

FIG. 2 is a perspective view showing a carrier handling apparatus of the module IC handler, FIG. 3 is a perspective view showing the press unit used for testing the module ICs according to the present invention, FIG. 4 is a perspective view showing a carrier used for containing the module ICs according to the present invention, and FIG. 9 is a plan view of the carrier handling apparatus according to the present invention.

The base frame 12 has one side of upper portion thereof provided with the vertical frame 10, and the entire portion thereof is provided with the respective test sites 102.

The test site 102 consists of the press unit 104 and the carrier unit 106.

The LM guide rails 14 are disposed parallel at upper portion surfaces of the base frame 12. The carrier unit 106 is provided at the upper portion of the LM guide rails 14 such that the carrier unit 106 slides right and left, and the driving motor 16 provided with the pulley 18 is mounted. The timing belt 20 is connected to the pulley 18, and carries the carrier unit 106 fixed to the timing belt 20.

Meanwhile, the press unit 104 is provided with the unit bracket 36 at which the motor bracket 38 provided at one side of the vertical frame 10 is formed. The pair of guides 44 being able to vertically guide the press unit 106 are vertically provided at the entire portion of the unit bracket 36, and the ball screw 42 is vertically provided between the pair of guides 44.

At the lower portions of the ball screw 42 and guides 44, are provided the catcher fixing blocks 46 having both side portions thereof provided with the catcher 48 being capable of holding the carrier and lower portion thereof to which the module press unit 50 is fixed.

The ball screw 42 and guides 44 have the upper portions thereof provided with guide plate 40. At the upper portion of the ball screw 42, is provided the press unit motor 34 so as to rotate the ball screw 42 to thereby allow the module press unit 50 to be lowered. Therefore, the module IC contained in the carrier can be connected to the test socket.

The carrier unit 106, in which the module ICs to be tested are accommodated therein, has a box-shaped carrier 24 fixed at the upper portion of the carrier holder 22 and containing the plural module ICs therein.

The carrier 24 has right and left side portions thereof fixedly provided with the blocks 34, respectively. The springs 28 are installed between the blocks 34 and the carrier holder 22, such that the blocks 34 isolated after being pressed by the press unit 104 are returned to their initial positions. The sensors 30 are provided which are used to detect whether or not the module ICs are accurately placed at right and left side portions of the carrier 24.

Referring to FIG. 9 showing a plan view of the carrier handling apparatus according to the present invention, the carrier unit 106, coupled to the pulleys 18 being driven to be rotated by the driving motors 16, its slidably moved. The carrier unit 106 can be moved by means of the timing belt until it arrives at the position where the carrier unit 106 can be in contact with the test socket.

The carrier unit 106 is sequentially provided to a press/test position 108 located at upper portion of the base frame 12 and then to a loading/unloading position 110 located adjacent thereto. Also, another press/test position 108 and the loading/unloading position 110 with the same structure as the above positions, are also located at a right side of the above-mentioned positions 108, 110, by which the module ICs to be tested can be continuously supplied.

A handling method of the carrier handling apparatus of the module IC handler thus constructed will be described below.

Figure 10:
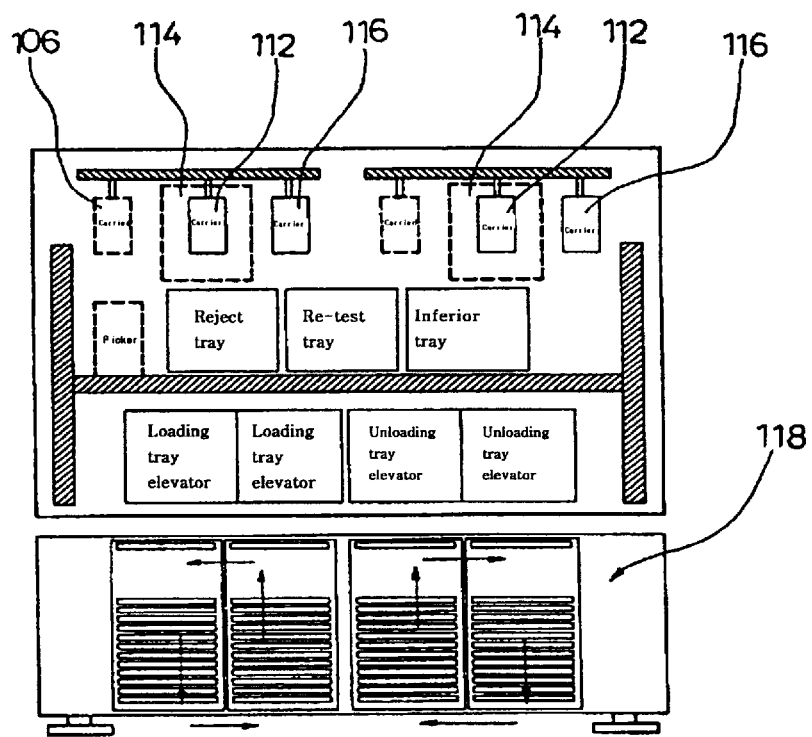
In FIGS. 10 to 16 showing sequential processes showing the handling method using the carrier handling apparatus according to the present invention.
Figure 11:
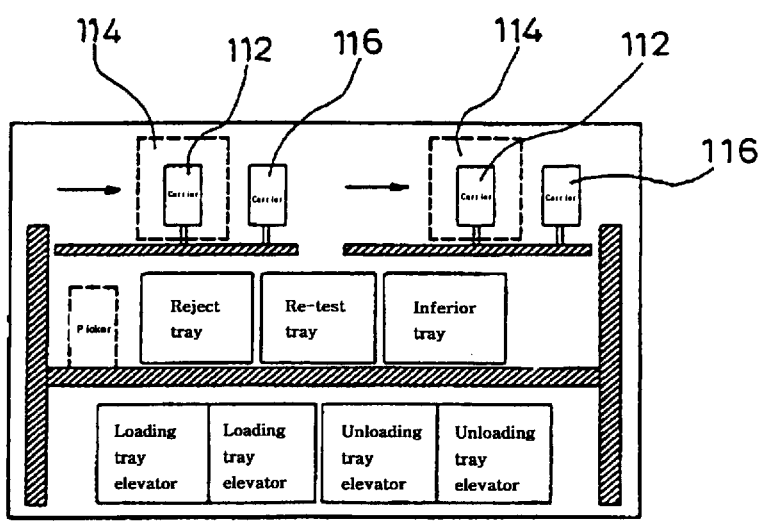
Figure 12:
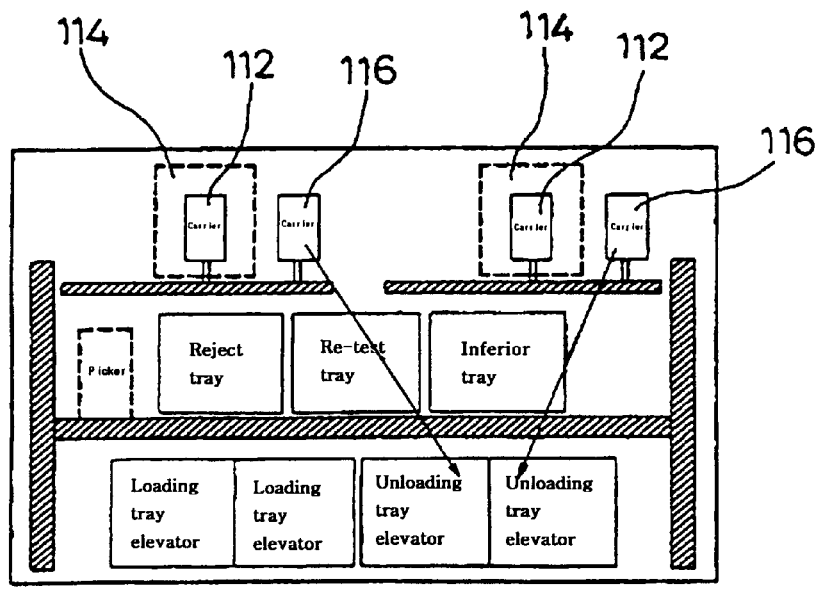
Figure 13:
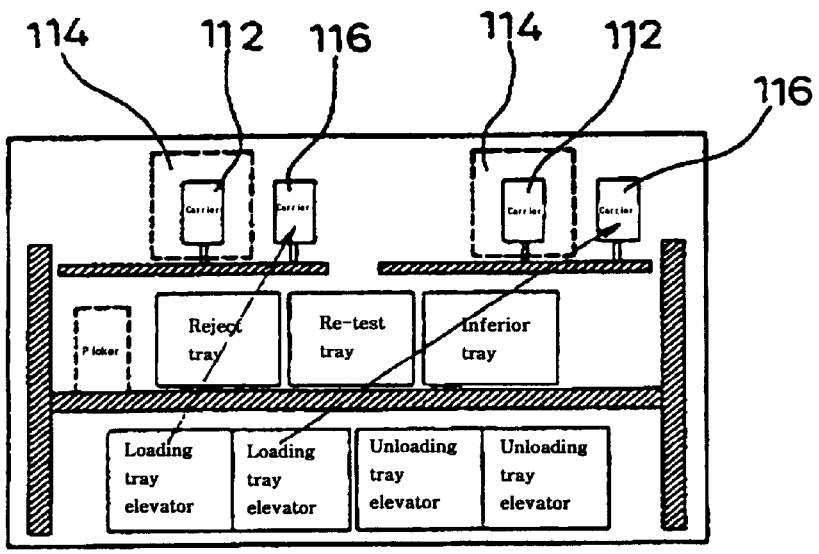
Figure 14:
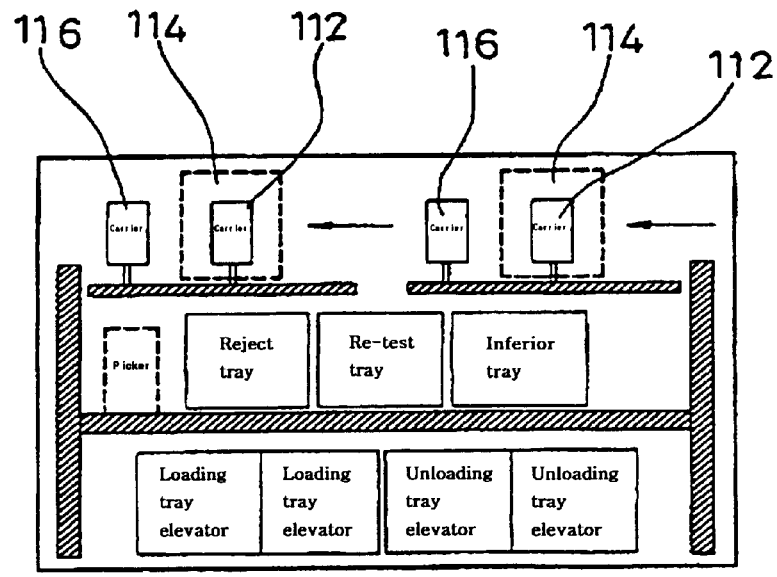
Figure 15:
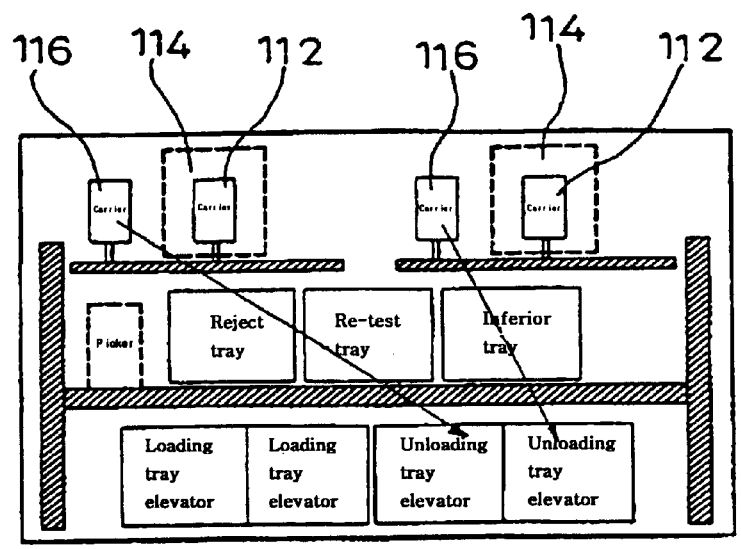
Figure 16:
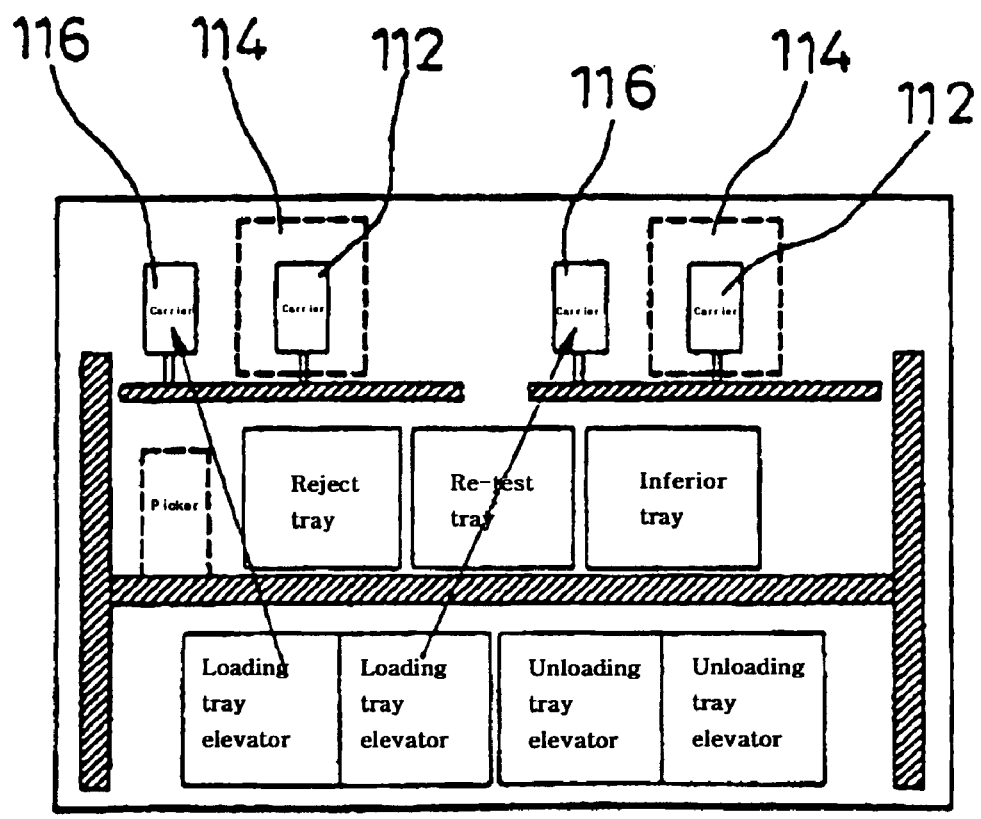

FIGS. 10 to 16 show sequential processes showing the handling method using the carrier handling apparatus according to the present invention. FIG. 10 is a schematic diagram showing a whole system of the carrier handling apparatus, FIG. 11 is a process diagram showing a step of indexing/testing the carrier by using the carrier handling apparatus, FIG. 12 is a process diagram showing a step of unloading the carrier, FIG. 13 is a process diagram showing a step of loading the carrier from a tray elevator, FIG. 14 is a process diagram showing a step of indexing/testing the loaded carrier, FIG. 15 is a process diagram showing a step of unloading the test-finished carrier, and FIG. 16 is a process diagram showing a step of loading the carrier from the tray elevator.

For the method for handling the carrier according to the present invention, to test the module ICs, respective carriers each containing the module ICs therein, positioned at their initial positions, are moved to the press/test position 108 and the loading/unloading position 110.

While the module ICs contained in the carrier having been moved to the press/test position 108 are being-tested, the carrier positioned at the loading/unloading position 110 is moved to the unloading tray elevator.

Next, after the carrier has been moved to the unloading elevator, another carrier in the loading tray elevator is moved to the loading/unloading position 110.

The test-finished carrier at the press/test position 108 is moved to its initial position, and the carrier moved to the loading/unloading position 110 is moved to the press/test position 108.

While the respective carriers moved from the loading/unloading position 110 to the press/test position 108 are tested, another respective carriers having been tested and returned to respective initial positions are moved to the unloading tray elevator.

After the test-finished carriers have been moved to the unloading tray elevator, these carriers are moved from the loading tray elevator to their initial positions.

The details of the method for handling the carrier according to the present invention will be given below, with reference to the drawings.

Referring to FIG. 10, the elevator 118 is shown which supplies the plural module ICs. Above upper portion of the elevator 118, there are provided the respective loading tray and unloading tray elevators which are supplied from the elevator 118. There are also provided above the tray elevators a reject tray, a retest tray and a failure tray, the reject tray being used for receiving the discharged module ICs after the test of the module ICs has been completed, the retest tray being used for receiving the module ICs to be re-tested, and the failure tray being used for receiving the module ICs whose characteristics are determined to be failed.

Further, there are located the press/test position 114 and the loading/unloading position 116 above the respective tray. The press/test position 114 is provided with a test head 112 adapted to test the carrier moved thereto. The carrier 24 is moved right and left to be tested and loaded/unloaded.

For continued tests and supply of the carrier, another press/test position 114 and loading/unloading position 116 of the same structure as the previously mentioned position 114, 116 are provided adjacent thereto.

Next, the method for handling the carrier according to the present invention will be explained below, with reference to FIGS. 11 to 13. The respective carriers 24 at their initial positions are moved to the press/test position 114 and the loading/unloading position 116. The carriers 24 moved to the press/test position 114 are at an indexing/testing step where the carriers 24 are in contact with the test head 112 by means of the press unit 104 to be tested.

While the test for the carriers 24 are performed, another carriers 24 moved to the loading/unloading position 116 are moved to the unloading tray elevator, as shown in FIG. 11. As shown in FIG. 12, new carriers 24 are loaded from the loading tray elevator to the loading/unloading position 16.

Subsequently, FIG. 14 is a process diagram shown a step of indexing/testing the loaded carrier, FIG. 15 is a process diagram showing a step of unloading the test-finished carrier, and FIG. 16 is a process diagram showing a step of loading the carrier from the tray elevator.

As shown in FIG. 12, the loading of the carrier 24 to the loading/unloading position 116 is made, whereas the test at the press/test position 114 is completed. Then, the respective carriers 24 are moved leftward, i.e., and the carriers 24 tested at the press/test position 114 are moved to the loading/unloading position 116. The carrier 24 loaded into the loading/unloading position 116 is moved to the press/test position 114.

While the carriers 24 moved to the press/test position 114 are being tested, the carriers 24 positioned at the loading/unloading position 116 are moved to the unloading tray elevator, again. If the carriers 24 are moved to the unloading tray elevator, new carriers 24 from the loading tray elevator are loaded, as shown in FIG. 16, by which a cycle is completed. Continuously, the cycles as mentioned above are repeated, thus sequential tests and supply procedures are made.

According the foregoing, advantages are given in that a time for which the carrier being tested and the carrier to be supplied wait is shortened, and therefore a faster work becomes possible, and the productivity can be enhanced by the continued tests and supply of the carriers.

Further, in case the spacing(s) of the moving support bases porting the module ICs can be readily adjusted by rotating the ball screw, the use of only one carrier becomes possible in transferring and loading various kinds of the module ICs.

As described above, simple construction and method of the carrier handling apparatus of the module IC handler according to the present invention are provided, the test time is shortened, an efficiency by faster work is enhanced and the thus productivity are improved by a stand-by of the subsequent carrier while one carrier is being tested.

Further, since the spacing(s) of the moving support bases supporting the module ICs can be readily adjusted by rotating the ball screw, the use of only one carrier becomes possible in transferring and loading various kinds of the module ICs. Therefore, the preparation of the respective carriers for each of the module ICs is not required, so any cost associated therewith dose not occur.

Moreover, the storage of only one carrier is enough, thus resulting in reduction of parts needed to transfer and load the module ICs, and of the space required to store the carrier.

We claim:

1. A carrier handling apparatus for a module IC (integrated circuit) handler, the apparatus comprising:

a base frame;

a vertical frame provided perpendicular to one side of the base frame;

a carrier holder mounted on the base frame and configured to hold a plurality of module IC carriers, each module IC carrier being configured to hold a plurality of module ICs; and at least one press unit mounted on the vertical frame, wherein the at least one press unit is configured to press module ICs contained in a module IC carrier held by the carrier holder into a test socket.

2. The carrier handling apparatus of claim 1, wherein the carrier holder comprises a plurality of springs, and wherein module IC carriers are mountable on the carrier holder such that at least one spring is interposed between the carrier holder and each module IC carrier.

3. The carrier handling apparatus of claim 1, wherein module IC carriers mounted on the carrier holder can move between first and second positions, and wherein the carrier holder also includes a plurality of position sensors, each position sensor being configured to detect a position of a module IC carrier on the carrier holder.

4. The carrier handling apparatus of claim 1, wherein the at least one press unit comprises at least one catcher that is configured to be coupled to a catcher holder of a module IC carrier mounted on the carrier holder, and wherein the press unit is configured to move a module IC carrier away from a test socket, using the catcher, to remove module ICs mounted in the module IC carrier from the test socket.

5. The carrier handling apparatus of claim 1, wherein the at least one press unit comprises:
- at least one vertical guide member;
- a ball screw vertically provided proximate to the at least one vertical guide member;
- a guide plate having a threaded aperture, through which the ball screw is threaded, wherein the guide plate is fixedly connected to an upper portion of the at least one vertical guide member;
- at least one catcher fixing block fixed to a lower portion of the at least one vertical guide member; and
- a module press unit installed at a lower portion of the at least one catcher fixing block and configured to insert module ICs into a test socket.

6. The carrier handling apparatus of claim 5, further comprising at least one catcher coupled to the catcher fixing block and configured to extract module ICs from the test socket.

7. The carrier handling apparatus of claim 5, further comprising a press unit motor coupled to the ball screw and configured to rotate the ball screw to cause the guide plate and the at least one vertical guide to move vertically, and to thereby cause the at least one catcher fixing block to move vertically.

8. The carrier handling apparatus of claim 1, further comprising at least one guide rail mounted on the base frame, wherein the carrier holder is configured to move along the at least one guide rail.

9. The carrier handling apparats of claim 8, further comprising a motor unit configured to move the carrier holder along the at least one guide rail such that individual ones of a plurality of module IC carriers held on the carrier holder can be positioned under the at least one press unit.

10. The carrier handling apparatus of claim 9, wherein the motor unit comprises:
- a belt coupled to the carrier holder; and
- a motor coupled to the belt and configured to move the belt, to thereby move the carrier holder.

11. The carrier handling apparatus of claim 1, further comprising at least one module IC carrier mounted on the carrier holder, wherein each module IC carrier comprises:
- a case for receiving a plurality of module ICs;
- guides disposed within the case and opposite to each other;
- movable support bases comprising, a plurality of insertion members configured to receive the module ICs; and
- an operating unit for adjusting and controlling a spacing between the movable support bases.

12. The carrier handling apparatus of claim 11, wherein the operating unit comprises:
- a guide aperture formed in each movable support base;
- at least one guide rod slidably penetrating through each of the guide apertures and having ends thereof fixed to the case;
- at least one double-threaded screw comprising a right-handed thread and a left-handed thread, each of the threads being screwed into respective ones of the movable support bases such that when the double-threaded screw is rotated, each of the movable support bases are moved inwardly or outwardly relative to each other; and
- a driving unit coupled to and configured to rotate the double-threaded screw.

13. The carrier handling apparatus of claim 12, wherein the driving unit comprises a rotating knob coupled to the at least one double-thread screw.

14. The carrier handling apparatus of claim 12, further comprising a position confinement unit configured to fix the position of said movable support bases.

15. The carrier handling apparatus of claim 14, wherein the position confinement unit comprises:
- a fixing hole formed in each movable support base, wherein the fixing hole penetrates up to the guide aperture; and
- a fixing bolt threadably inserted into the fixing hole.

16. The carrier handling apparatus of claim 12, wherein the at least one double threaded screw comprises two double threaded screws, and wherein the driving unit comprises:
- a pair of first pulleys, each of the first pulleys being fixed onto one of the double-threaded screws;
- a second pulley that is rotatably mounted on the case; and
- a belt operatively connecting the first pulleys and the second pulley.

17. The carrier handling apparatus of claim 16, further comprising a tension adjusting unit configured to adjust a tension of the belt.

18. The carrier handling apparatus of claim 17, wherein the tension adjusting unit comprises:
- a bracket on which the second pulley is rotatable mounted;
- an elongated hole formed in the bracket; and
- a bolt used to fasten the bracket to the case through the elongated hole.

19. The carrier handling apparatus of claim 16, further comprising:
- a motor coupled to the second pulley and configured to rotate the second pulley; and
- a control unit configured to control the motor to rotate the second pulley clockwise or counterclockwise.

20. A module IC (integrated circuit) carrier handling apparatus, comprising:
- a base frame;
- a vertical frame attached to the base frame;
- a plurality of guide rails attached to said base frame substantially parallel to each other;
- a first pulley attached proximate to a first end of said base frame and a second pulley attached proximate to a second end of said base frame;
- a timing belt coupled to the first and second pulleys;
- a driving motor coupled to one of the first and second pulleys and configured to cause the timing belt to move on the first and second pulleys; and
- a carrier holding unit mounted on the guide rails and coupled to the timing belt, wherein the carrier holding unit is configured to hold a plurality module IC carriers, each module IC carrier holding a plurality of module ICs, and wherein movement of the timing belt caused by rotation of the driving motor will cause the carrier holding unit to move along the guide rails; and
- a press unit attached to said vertical frame and configured to insert a plurality of module ICs contained within a module IC carrier on the carrier holder into a test socket.

21. The module IC carrier handling apparatus of claim 20, wherein said press unit further comprises:
- a motor disposed above said base frame; and
- at least one catcher fixing block coupled to said motor and configured to move toward a test socket to insert module ICs into the test socket.

22. The module IC carrier handling apparatus of claim 21, wherein the catcher fixing block is also configured to move away from the test socket to remove module ICs from the test socket.

23. The module IC carrier handling apparatus of claim 20, further comprising at least one module IC carrier mounted on the carrier holding unit.

24. The module IC carrier handling apparatus of claim 23, wherein the module IC carrier is mounted on the carrier holder such that the press unit can move the module IC carrier between a first position which allows the carrier holding unit to move along the guide rails and a second position in which module ICs contained within the module IC carrier are inserted into a test socket.

25. The module IC carrier handling apparatus of claim 24, further comprising a plurality of springs positioned between the carrier holder and the module IC carrier, wherein the springs are configured to bias the module IC carrier towards the first position.

26. The module IC carrier handling apparatus of claim 24, further comprising at least one sensor configured to detect when the module IC carrier is in the first position.

27. The module IC carrier handling apparatus of claim 23, wherein the module IC carrier is configured such that different sized module ICs can be mounted in the module IC carrier.

28. The module IC carrier handling apparatus of claim 27, wherein the module IC carrier comprises:

two guide rails; and two movable support bases that are slidably mounted on the guide rails and that are configured to support a plurality of module ICs, wherein the movable support bases can be moved toward and away from each other to vary a separation distance between the support bases, to thereby accommodate different sized module ICs.

29. A method for handling module IC carriers of a module IC handler apparatus, comprising:

moving a first module IC carrier containing module ICs to be tested from a loading position to a test position;

testing the module ICs while they remain in the module IC carrier; and moving the first module IC carrier from the test position to an unloading position while moving a second module IC carrier containing module ICs to be tested to the test position.

30. A method for handling a module IC carrier, comprising:

moving a module IC carrier containing a plurality of module ICs from a loading position to a test position;

inserting the plurality of module ICs contained within the module IC carrier into a respective plurality of test sockets with a press unit;

testing the plurality of module ICs;

removing the tested module ICs from the test sockets by pulling the module IC carrier away from the test socket with the press unit; and moving the module IC carrier to an unloading position.

* * * * *